(12) United States Patent
Son et al.

(10) Patent No.: US 11,784,190 B2
(45) Date of Patent: Oct. 10, 2023

(54) DISPLAY APPARATUS AND METHOD OF MANUFACTURING THE SAME

(71) Applicant: SAMSUNG DISPLAY CO., LTD., Yongin-si (KR)

(72) Inventors: Sewan Son, Yongin-si (KR); Moosoon Ko, Yongin-si (KR); Youngwoo Park, Yongin-si (KR); Jinsung An, Yongin-si (KR); Minwoo Woo, Yongin-si (KR); Juwon Yoon, Yongin-si (KR); Seongjun Lee, Yongin-si (KR); Wangwoo Lee, Yongin-si (KR); Jeongsoo Lee, Yongin-si (KR); Jiseon Lee, Yongin-si (KR); Deukmyung Ji, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 202 days.

(21) Appl. No.: 16/358,020

(22) Filed: Mar. 19, 2019

(65) Prior Publication Data
US 2020/0006451 A1 Jan. 2, 2020

(30) Foreign Application Priority Data

Jul. 2, 2018 (KR) .................. 10-2018-0076595

(51) Int. Cl.
*H01L 27/12* (2006.01)
*H10K 59/12* (2023.01)
(Continued)

(52) U.S. Cl.
CPC ...... *H01L 27/1218* (2013.01); *H01L 27/1222* (2013.01); *H01L 27/1255* (2013.01);
(Continued)

(58) Field of Classification Search
CPC ............. H01L 27/3262; H01L 27/3274; H01L 27/1214; H01L 27/1255; H01L 27/3265;
(Continued)

(56) References Cited

U.S. PATENT DOCUMENTS 6,156,472 A 12/2000 Segi et al.
6,172,721 B1 * 1/2001 Murade ................. G02F 1/1368
349/43

(Continued)

FOREIGN PATENT DOCUMENTS

JP 8-067526 A 3/1996
JP H8-181325 7/1996
(Continued)

*Primary Examiner* — Shaun M Campbell
*Assistant Examiner* — Aneta B Cieslewicz
(74) *Attorney, Agent, or Firm* — KILE PARK REED & HOUTTEMAN PLLC

(57) ABSTRACT

A display apparatus includes a substrate, a first thin-film transistor including a first semiconductor layer on the substrate, and a first gate electrode on the first semiconductor layer, the first gate electrode being insulated from the first semiconductor layer by a first gate insulating layer, an organic interlayer insulating layer covering the first gate electrode, a first conductive layer on the organic interlayer insulating layer, a first contact hole exposing a top portion of the first semiconductor layer by penetrating through the organic interlayer insulating layer and the first gate insulating layer, and a first protruding portion protruding from a top surface of the substrate between the substrate and the first semiconductor layer, the first protruding portion corresponding to the first contact hole, wherein the first conductive layer contacts the first semiconductor layer through the first contact hole.

19 Claims, 14 Drawing Sheets

(51) Int. Cl.
*H10K 59/124* (2023.01)
*H10K 59/121* (2023.01)
*H01L 29/786* (2006.01)
*H10K 59/122* (2023.01)
*H10K 71/00* (2023.01)
*H10K 50/81* (2023.01)
*H10K 50/82* (2023.01)
*H10K 59/123* (2023.01)

(52) U.S. Cl.
CPC ............ *H10K 59/12* (2023.02); *H10K 59/122* (2023.02); *H10K 59/124* (2023.02); *H10K 59/1213* (2023.02); *H10K 59/1216* (2023.02); *H10K 71/00* (2023.02); *H01L 27/1214* (2013.01); *H01L 29/78603* (2013.01); *H10K 50/81* (2023.02); *H10K 50/82* (2023.02); *H10K 59/123* (2023.02)

(58) Field of Classification Search
CPC ............ H01L 27/3258; H01L 27/1218; H01L 27/1222; H01L 27/3248; H01L 27/3246; H01L 27/3276; H01L 27/124; H01L 27/3279; H01L 27/3244; H01L 27/3211; H01L 29/78603; H01L 29/78606; H01L 29/78636; H01L 51/5206; H01L 51/5221; H01L 27/3259; H10K 59/1213; H10K 59/1216; H10K 59/124; H10K 59/8051; H10K 59/8052; H10K 59/122; H10K 59/131; H10K 59/12; H10K 59/35; H10K 59/1315; H10K 59/123; H10K 50/81; H10K 50/816; H10K 50/82; H10K 50/826

See application file for complete search history.

(56) References Cited

U.S. PATENT DOCUMENTS

| | | | |
|---|---|---|---|
| 6,610,997 B2 * | 8/2003 | Murade | H01L 27/1255 257/E27.113 |
| 9,705,008 B2 | 7/2017 | Li | |
| 10,192,890 B2 | 1/2019 | Park | |
| 10,192,891 B2 | 1/2019 | Murai et al. | |
| 2001/0025002 A1 | 9/2001 | Krumwiede et al. | |
| 2002/0044230 A1 * | 4/2002 | Yamazaki | H01L 21/02631 349/43 |
| 2002/0110940 A1 * | 8/2002 | Yamagata | H01L 27/3246 438/22 |
| 2005/0218409 A1 * | 10/2005 | Um | H01L 27/3244 257/72 |
| 2005/0231668 A1 | 10/2005 | Kim et al. | |
| 2008/0149731 A1 * | 6/2008 | Arai | H01L 27/13 235/492 |
| 2011/0147757 A1 * | 6/2011 | Kim | H01L 27/1255 257/E33.001 |
| 2014/0184973 A1 * | 7/2014 | Kim | G02F 1/136209 349/43 |
| 2014/0339514 A1 | 11/2014 | Oh et al. | |
| 2016/0204180 A1 * | 7/2016 | Lee | H01L 21/28008 438/23 |
| 2017/0062538 A1 * | 3/2017 | Kim | H01L 27/1218 |
| 2017/0148863 A1 | 5/2017 | Yoon et al. | |
| 2017/0338252 A1 * | 11/2017 | Lee | H01L 27/1251 |
| 2018/0005007 A1 * | 1/2018 | Du | G09G 3/3225 |
| 2018/0062105 A1 * | 3/2018 | Lius | H01L 27/1251 |
| 2018/0151654 A1 * | 5/2018 | Lee | H01L 27/3272 |
| 2018/0277614 A1 * | 9/2018 | Ono | H01L 27/3258 |
| 2018/0350889 A1 * | 12/2018 | Son | H01L 27/3248 |
| 2019/0123069 A1 * | 4/2019 | Yang | H01L 29/66969 |
| 2020/0119120 A1 * | 4/2020 | Feng | H01L 27/3272 |

FOREIGN PATENT DOCUMENTS

| | | |
|---|---|---|
| JP | 11-143103 A | 5/1999 |
| JP | 2003-8026 | 1/2003 |
| JP | 2017-168642 | 9/2017 |
| KR | 10-2004-0036987 A | 5/2004 |
| KR | 10-2005-0096617 A | 10/2005 |
| KR | 10-2006-0055100 | 5/2006 |
| KR | 10-2014-0135560 A | 11/2014 |
| KR | 10-2015-0108477 | 9/2015 |
| KR | 10-2017-0028986 | 3/2017 |
| KR | 10-2017-0060217 A | 6/2017 |
| KR | 10-2017-0122358 | 11/2017 |
| KR | 10-2017-0130671 | 11/2017 |

* cited by examiner

DISPLAY APPARATUS AND METHOD OF MANUFACTURING THE SAME

CROSS-REFERENCE TO RELATED APPLICATION

Korean Patent Application No. 10-2018-0076595, filed on Jul. 2, 2018, in the Korean Intellectual Property Office, and entitled: "Display Apparatus and Method of Manufacturing the Same," is incorporated by reference herein in its entirety.

BACKGROUND

1. Field

One or more embodiments relate to a display apparatus and a method of manufacturing the same.

2. Description of the Related Art

A display apparatus is an apparatus that visually displays data. Such a display apparatus includes a substrate divided into a display area and a non-display area. In the display area, a gate line and a data line are insulated from each other, and a plurality of pixel regions are defined as the gate line and the data line cross each other. Also, a thin-film transistor and a pixel electrode electrically connected to the thin-film transistor are provided in the display area according to each of the pixel regions. Also, an opposite electrode is provided commonly throughout the pixel regions in the display area. Various wires, a gate driver, a data driver, a controller, etc., which transmit electric signals to the display area, may be provided in the non-display area.

The use of the display apparatus has been diversified. Also, the display apparatus has a small thickness and is lightweight, and thus the range of use of the display apparatus is widening. As the display apparatus is widely used, designs for increasing a degree of integration are diversified with respect to designing a shape of the display apparatus.

SUMMARY

Embodiments are directed to a display apparatus including a substrate, a first thin-film transistor including a first semiconductor layer on the substrate, and a first gate electrode on the first semiconductor layer, the first gate electrode being insulated from the first semiconductor layer by a first gate insulating layer, an organic interlayer insulating layer covering the first gate electrode, a first conductive layer on the organic interlayer insulating layer, a first contact hole exposing a top portion of the first semiconductor layer by penetrating through the organic interlayer insulating layer and the first gate insulating layer, and a first protruding portion protruding from a top surface of the substrate between the substrate and the first semiconductor layer, the first protruding portion corresponding to the first contact hole, wherein the first conductive layer contacts the first semiconductor layer through the first contact hole.

The display apparatus may further include a storage capacitor including a lower electrode spaced apart from the first gate electrode on a same layer, and an upper electrode overlapping the lower electrode, the upper electrode being insulated from the lower electrode by a second gate insulating layer, a second contact hole exposing a top portion of the lower electrode by penetrating through the organic interlayer insulating layer and the second gate insulating layer, a second conductive layer on the organic interlayer insulating layer. the second conductive layer contacting the lower electrode through the second contact hole, and a second protruding portion protruding from the top surface of the substrate between the substrate and the first semiconductor layer, the second protruding portion corresponding to the second contact hole.

The upper electrode may include a storage opening embedded in the second contact hole, the second conductive layer passing through the storage opening. The first conductive layer and the second conductive layer may be connected to each other on the organic interlayer insulating layer.

The display apparatus may further include a second thin-film transistor overlapping the storage capacitor.

The first protruding portion may include an organic material. A shape of a top portion of the first protruding portion may be curved.

The first protruding portion may include at least one of an inorganic insulating material and a metal.

A top portion of the organic interlayer insulating layer may be flat.

The organic interlayer insulating layer may include a photosensitive organic layer.

The display apparatus may further include a buffer layer on the substrate. The first protruding portion may be between the buffer layer and the semiconductor layer.

The substrate may include a first resin layer, a first barrier layer, a second resin layer, and a second barrier layer, which are stacked sequentially on each other. The first and second resin layers may include an organic material. The first and second barrier layers may include an inorganic material.

Embodiments are also directed to a display apparatus including a substrate, a thin-film transistor on the substrate, the thin-film transistor including a semiconductor layer and a gate electrode, a storage capacitor on the substrate, an organic interlayer insulating layer covering the gate electrode and the storage capacitor, a conductive layer on the organic interlayer insulating layer, a contact hole penetrating through the organic interlayer insulating layer and exposing the semiconductor layer or one electrode of the storage capacitor, and a protruding portion between the substrate and the organic interlayer insulating layer, the protruding portion corresponding to the contact hole. A portion of the conductive layer may be embedded in the contact hole and may contact the semiconductor layer or the storage capacitor.

A top surface of the organic interlayer insulating layer may be flat.

The organic interlayer insulating layer may include a photosensitive organic material.

The protruding portion may include an organic material. A shape of a top portion of the protruding portion may be curved.

The protruding portion may include at least one of an inorganic insulating material and a metal.

Embodiments are also directed to a method of manufacturing a display apparatus that includes a thin-film transistor that includes a semiconductor layer and a gate electrode. The method includes forming at least one protruding portion at a pre-set location on a substrate, forming the semiconductor layer such that at least a portion of the semiconductor layer is provided on the at least one protruding portion, forming a first gate insulating layer to cover the semiconductor layer on the substrate, forming the gate electrode on the first gate insulating layer such that the gate electrode overlaps the semiconductor layer, forming an organic interlayer insulating layer to cover the gate electrode on the substrate, and forming an organic contact hole penetrating through the organic interlayer insulating layer to correspond to the at least one protruding portion.

The organic interlayer insulating layer may include a photosensitive organic material. The organic contact hole may be formed on the organic interlayer insulating layer through an exposure process and a developing process.

The method may further include forming a second gate insulating layer to be below the organic interlayer insulating layer and to cover the gate electrode, and forming an inorganic contact hole communicating with the organic contact hole on the second gate insulating layer. The inorganic contact hole may be formed using the organic interlayer insulating layer as a blocking member.

The at least one protruding portion may include an organic material. A shape of a top portion of the at least one protruding portion may be curved.

The at least one protruding portion may include at least one of an inorganic insulating material and a metal.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
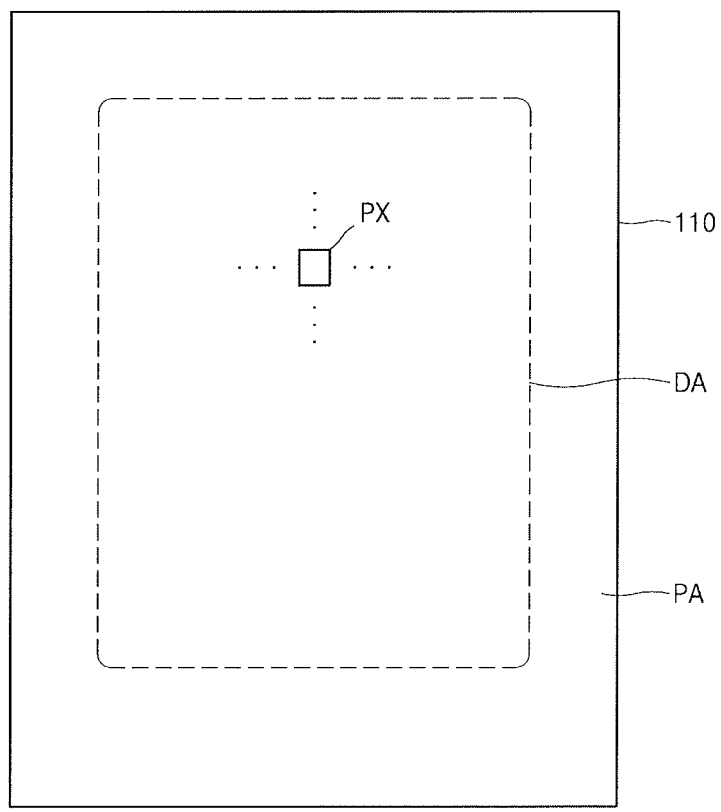
FIG. 1 illustrates a plan view of a display apparatus according to an embodiment.
Figure 1:
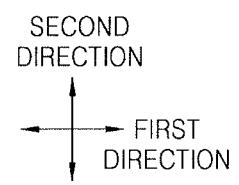

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate. it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

When a certain embodiment may be implemented differently, a specific process order may be performed differently from the described order. For example, two consecutively described processes may be performed substantially at the same time or performed in an order opposite to the described order.

The term "display apparatus" refers to an apparatus displaying an image. The display apparatus may be a liquid crystal display (LCD), an electrophoretic display, an organic light-emitting display, an inorganic light-emitting display, a field emission display, a surface-conduction electron-emitter display, a plasma display, or a cathode ray display, as examples. Hereinafter, an organic light-emitting display is described as an example of a display apparatus according to an embodiment.

FIG. 1 illustrates a plan view of a display apparatus according to an embodiment.

Referring to FIG. 1, the display apparatus includes a display area DA and a peripheral area PA, which is a non-display area. Pixels PX including a display device are arranged in the display area DA to provide a certain image.

Each pixel PX emits, for example, red, green, blue, or white light. For example, each pixel PX may include an organic light-emitting diode. Each pixel PX may further include a device such as a thin-film transistor (TFT), a capacitor, etc.

In the present specification, as described above, the term "pixel PX" encompasses a sub-pixel emitting red, green, blue, or white light.

The peripheral area PA is an area where an image is not provided. The peripheral area PA may include a scan driver, data driver, etc. for providing an electric signal to be applied to the pixels PX, and power lines providing power such as a driving voltage and a common voltage.

Figure 2A:
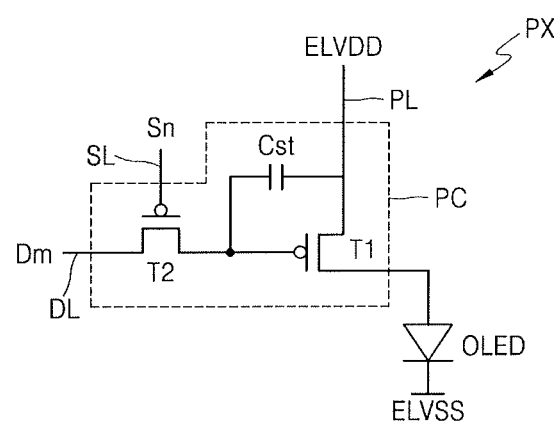
FIGS. 2A and 2*b* illustrate equivalent circuit diagrams of one pixel of a display apparatus, according to an embodiment.
Figure 2B:
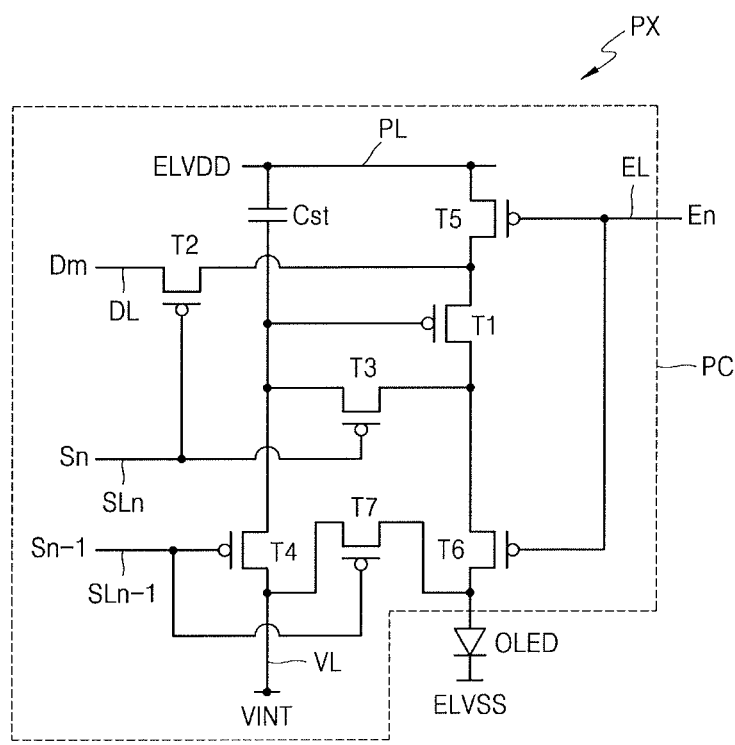

FIGS. 2A and 2B illustrate equivalent circuit diagrams of one pixel PX of a display apparatus, according to an embodiment.

Referring to FIG. 2A, each pixel PX may include a pixel circuit PC connected to a scan line SL and a data line DL, and an organic light-emitting diode OLED connected to the pixel circuit PC.

The pixel circuit PC may include a driving TFT T1, a switching TFT T2, and a storage capacitor Cst. The switching TFT T2 may be connected to the scan line SL and the data line DL and may transmit a data signal Dm received through the data line DL to the driving TFT T1 according to a scan signal Sn received through the scan line SL.

The storage capacitor Cst is connected to the switching TFT T2 and a driving voltage line PL. The storage capacitor Cst may store a voltage corresponding to a difference between a voltage received from the switching TFT T2 and a first power voltage EVDD (or a driving voltage) supplied to the driving voltage line PL.

The driving TFT T1 may be connected to the driving voltage line PL and the storage capacitor Cst and may control a driving current flowing from the driving voltage line PL to the organic light-emitting diode OLED according to a value of a voltage stored in the storage capacitor Cst. The organic light-emitting diode OLED may emit light having certain luminance according to the driving current.

In FIG. 2A, The pixel circuit PC may have various structures. As an example, the pixel circuit illustrated in FIG. 2A includes two TFTs and one storage capacitor.

Referring to FIG. 2B, the pixel circuit PC may include driving and switching TFTs T1 and T2, a compensation TFT T3, a first initialization TFT T4, an operation control TFT T5, an emission control TFT T6, and a second initialization TFT T7.

In FIG. 2B, signal lines (a scan line SLn, a previous scan line SLn-1, an emission control line EL, and the data line DL), an initialization voltage line VL, and the driving voltage line PL are provided in each pixel PX. In some implementations, at least one of the signal lines and/or the initialization voltage line VL may be shared between neighboring pixels PX.

A drain electrode of the driving TFT T1 may be electrically connected to the organic light-emitting diode OLED through the emission control TFT T6. The driving TFT T1 may supply a driving current to the organic light-emitting diode OLED by receiving the data signal Dm according to a switching operation of the switching TFT T2.

A gate electrode of the switching TFT T2 may be connected to the scan line SL, and a source electrode may be connected to the data line DL. A drain electrode of the switching TFT T2 may be connected to a source electrode of the driving TFT T1 while being connected to the driving voltage line PL through the operation control TFT T5.

The switching TFT T2 may be turned on according to the scan signal Sn received through the scan line SL. The switching TFT T2 may perform a switching operation in which the data signal Dm transmitted to the data line DL is transmitted to the source electrode of the driving TFT T1.

A gate electrode of the compensation TFT T3 may be connected to the scan line SLn. A source electrode of the compensation TFT T3 may be connected to the drain electrode of the driving TFT T1 while being connected to a pixel electrode of the organic light-emitting diode OLED through the emission control TFT T6. A drain electrode of the compensation TFT T3 may be connected together with any one electrode of the storage capacitor Cst, a source electrode of first initialization TFT T4, and the gate electrode of the driving TFT T1. The compensation TFT T3 may be turned on according to the scan signal Sn received through the scan line SL and may diode-connect the driving TFT T1 by connecting the gate electrode and the drain electrode of the driving TFT T1 to each other.

A gate electrode of the first initialization TFT T4 may be connected to the previous scan line SLn-1. A drain electrode of the first initialization TFT T4 may be connected to the initialization voltage line VL. The source electrode of the first initialization TFT T4 may be connected together with any one electrode of the storage capacitor Cst, the drain electrode of the compensation TFT T3, and the gate electrode of the driving TFT T1. The first initialization TFT T4 may be turned on according to a previous scan line Sn-1 received through the previous scan line SLn-1. The first initialization TFT T4 may perform an initialization operation in which a voltage of the gate electrode of the driving TFT T1 is initialized by transmitting an initialization voltage VINT to the gate electrode of the driving TFT T1.

A gate electrode of the operation control TFT T5 may be connected to the emission control line EL. A source electrode of the operation control TFT T5 may be connected to the driving voltage line PL. A drain electrode of the operation control TFT T5 may be connected to the source electrode of the driving TFT T1 and the drain electrode of the switching TFT T2.

A gate electrode of the emission control TFT T6 may be connected to the emission control line EL. A source electrode of the emission control TFT T6 may be connected to the drain electrode of the driving TFT T1 and the source electrode of the compensation TFT T3. A drain electrode of the emission control TFT T6 may be electrically connected to the pixel electrode of the organic light-emitting diode OLED. The operation and emission control TFTs T5 and T6 are simultaneously turned on according to an emission control signal En received through the emission control line EL. Thus, the first power voltage ELVDD may be transmitted to the organic light-emitting diode OLED, and a driving current may flow through the organic light-emitting diode OLED.

A gate electrode of the second initialization TFT T7 may be connected to the previous scan line SLn-1. A source electrode of the second initialization TFT T7 may be connected to the pixel electrode of the organic light-emitting diode OLED. A drain electrode of the second initialization TFT T7 may be connected to the initialization voltage line VL. The second initialization TFT T7 may be turned on according to the previous scan signal Sn-1 received through the previous scan line SLn-1 to initialize the pixel electrode of the organic light-emitting diode OLED.

In FIG. 2B, the first and second initialization TFTs T4 and T7 are shown as being connected to the previous scan line SLn-1. In some implementations, the first initialization TFT T4 may be driven according to the previous scan signal Sn-1 by being connected to the previous scan line SLn-1, and the second initialization TFT T7 may be driven according to a signal transmitted to a corresponding scan line by being connected to a separate signal line (for example, a subsequent scan line).

Another electrode of the storage capacitor Cst may be connected to the driving voltage line PL. Any one electrode of the storage capacitor Cst may also be connected to the gate electrode of the driving TFT T1, the drain electrode of the compensation TFT T3, and the source electrode of the first initialization TFT T4.

An opposite electrode (for example, a cathode) of the organic light emitting diode OLED may receive a second power voltage ELVSS (or a common power voltage). The organic light-emitting diode OLED may emit light by receiving a driving current from the driving TFT T1.

The circuit design and the numbers of TFTs and storage capacitors may vary from what is shown in FIGS. 2A and 2B.

Figure 3:
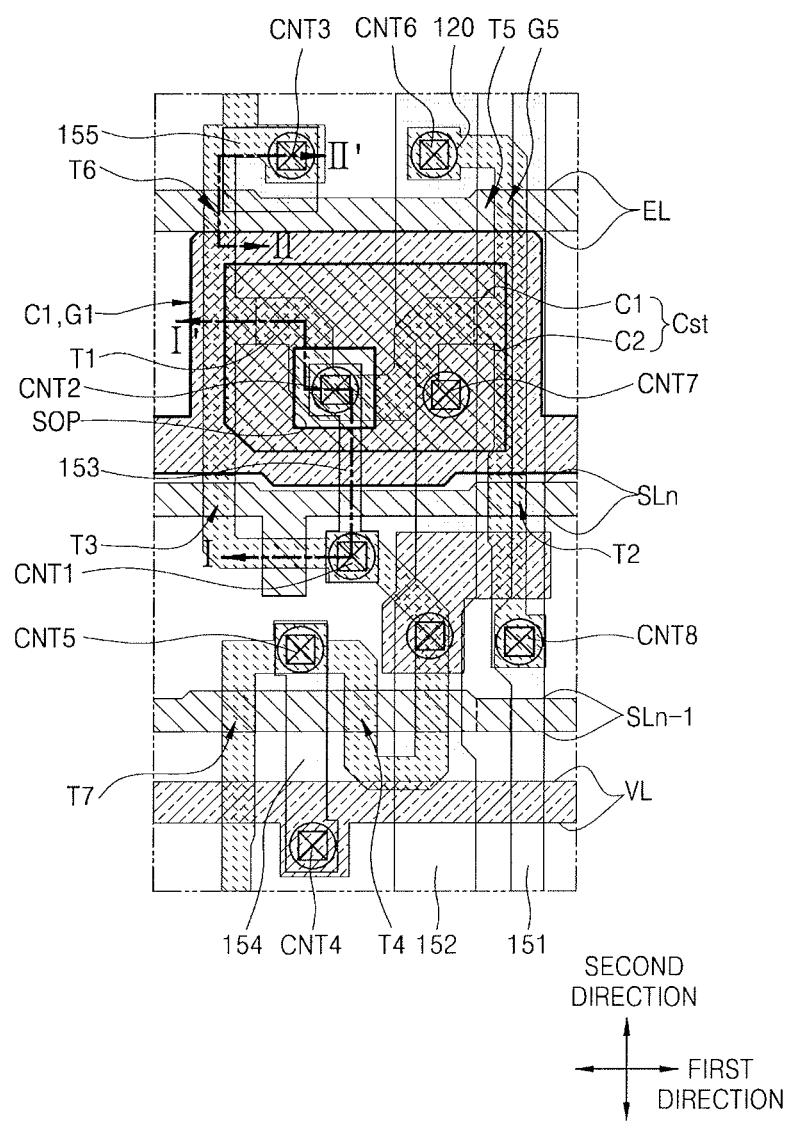
FIG. 3 illustrates an arrangement plan of locations of a plurality of thin-film transistors and a capacitor included in a pixel circuit, according to an embodiment.
Figure 4:
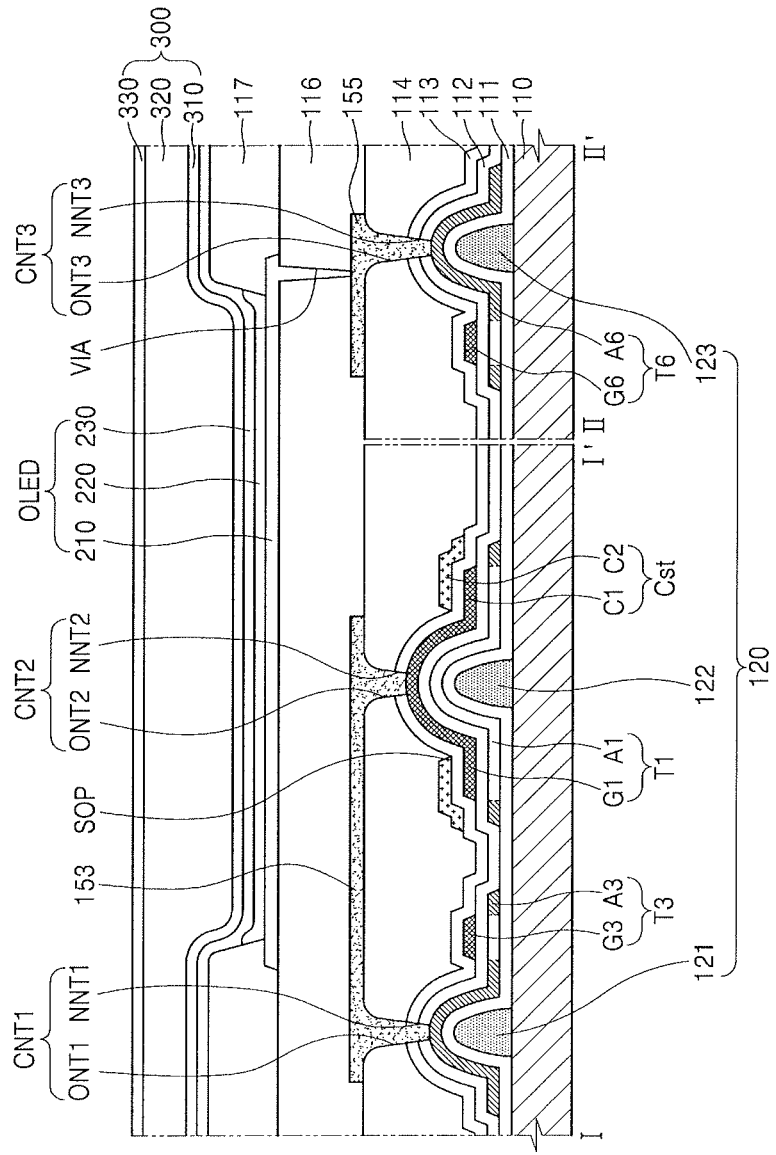
FIG. 4 illustrates a cross-sectional view taken along a line I-I' and II-II' of FIG. 3, including an organic light-emitting diode.

FIG. 3 illustrates an arrangement plan of locations of a plurality of TFTs and a capacitor included in a pixel circuit, according to an embodiment. FIG. 4 illustrates a cross-sectional view taken along a line I-I' and II-II' of FIG. 3, including the organic light-emitting diode OLED.

Referring to FIG. 3, a pixel of a display apparatus according to an embodiment may include a scan line SLn, a previous scan line SLn-1, an emission control line EL, and an initialization voltage line VL, which extend in a first direction, and may include a data line 151 and a driving voltage line 152, which extend in a second direction to cross the scan line SLn, the previous scan line SLn-1, the emission control line EL, and the initialization voltage line VL.

The pixel may include the driving TFT T1, the switching TFT T2, the compensation TFT T3, the first initialization TFT T4, the operation control TFT T5, the emission control TFT T6, the second initialization TFT T7, and the storage capacitor Cst.

Semiconductor layers of the driving TFT T1, the switching TFT T2, the compensation TFT T3, the first initialization TFT T4, the operation control TFT T5, the emission control TFT T6, and the second initialization TFT T7 may be provided on the same layer and may be curved in various shapes while being connected to each other.

The semiconductor layer may include a channel region, and source and drain regions respectively on two sides of the channel region. Impurities may be doped on the source and drain regions. The impurity may be, for example an N-type or P-type impurity. The source and drain regions may respectively correspond to a source electrode and a drain electrode. Hereinafter, the terms source and drain regions are used instead of the source and drain electrodes.

The driving TFT T1 may include a driving semiconductor layer and a driving gate electrode G1. The driving semiconductor layer may have a curved shape such that a driving channel region is longer than other channel regions. For example, the driving semiconductor layer may have a shape that is curved a plurality of times, such as an 'Ω' or 'S' shape, such that a long channel length is formed within a small space. When the driving channel region is elongated, a driving range of a gate voltage applied to the driving gate electrode G1 may be increased, and thus a gray scale of light emitted from the organic light-emitting diode OLED may be accurately controlled and display quality may be increased. The driving gate electrode G1 may be an island type and may overlap the driving channel region with a first gate insulating layer 112 (see FIG. 4) therebetween.

The storage capacitor Cst may overlap the driving TFT T1. The storage capacitor Cst includes a lower electrode C1 and an upper electrode C2. The driving gate electrode G1 may function not only as the gate electrode of the driving TFT T1, but also as the lower electrode C1 of the storage capacitor Cst. For example, the driving gate electrode G1 and the lower electrode C1 may be integrated to each other. The upper electrode C2 of the storage capacitor Cst may overlap the lower electrode C1 with a second gate insulating layer 113 (see FIG. 4) therebetween.

The upper electrode C2 of the storage capacitor Cst may overlap the lower electrode C1. The upper electrode C2 may include a storage opening SOP. The storage opening SOP may be formed by removing a part of the upper electrode C2. The storage opening SOP may have a single closed-curve shape. Herein, the term "single closed-curve shape" denotes a closed figure having the same starting point and ending point when a dot is put on straight lines or curved line, such as a polygon or a circle. Such an upper electrode C2 including the storage opening SOP may have a donut shape. A contact hole CNT2 for connecting the driving gate electrode G1 and a first node connection line 153 may be provided in the storage opening SOP.

Some of protruding portions of the scan line SLn, previous scan line SLn-1, emission control line EL, initialization voltage line VL may correspond to the gate electrodes of the switching TFT T2, compensation TFT T3, first initialization TFT T4, operation control TFT T5, emission control TFT T6, and second initialization TFT T7. The scan line SLn, the previous scan line SLn-1, the emission control line EL, and the initialization voltage line VL may be provided on the same layer, for example, on the first gate insulating layer 112. For example, the initialization voltage line VL may be provided on a same layer as the semiconductor layer, or on a same layer as the upper electrode C2.

The switching TFT T2 may include a switching semiconductor layer and a switching gate electrode. One side of the switching semiconductor layer may be connected to the data line 151 through a contact hole CNT8, and the other side of the switching semiconductor layer may be connected to the driving semiconductor layer. The switching gate electrode may be provided as a part of the scan line SLn.

The compensation TFT T3 may include a compensation semiconductor layer and a compensation gate electrode. One side of the compensation semiconductor layer may be connected to the first node connection line 153 through the contact hole CNT1. The other side of the compensation semiconductor layer may be connected to the driving semiconductor layer and an emission control semiconductor layer. The compensation gate electrode may be provided as a part of the scan line SLn.

The first initialization TFT T4 may include a first initialization semiconductor layer and a first initialization gate electrode. One side of the first initialization semiconductor layer may be connected to the initialization voltage line VL through contact holes CNT4 and CNT5 and a second node connection line 154. The other side of the first initialization semiconductor layer may be bridge-connected to the driving gate electrode G1 through the first node connection line 153. The first initialization gate electrode may be provided as a part of the previous scan line SLn-1.

The operation control TFT T5 may include an operation control semiconductor layer and an operation control gate electrode. One side of the operation control semiconductor layer may be connected to the driving voltage line 152 through a contact hole CNT6. The other side of the operation control semiconductor layer may be connected to the driving semiconductor layer. The operation control gate electrode may be provided as a part of the emission control line EL.

The emission control TFT T6 may include the emission control semiconductor layer and an emission control gate electrode. One side of the emission control semiconductor layer may be connected to the driving semiconductor layer. The other side of the emission control semiconductor layer may be connected to a connection electrode 155 through a contact hole CNT3. The connection electrode 155 may be connected to a pixel electrode 210 (see FIG. 4) of the organic light-emitting diode OLED. The emission control gate electrode may be provided as a part of the emission control line EL.

The second initialization TFT T7 may include a second initialization semiconductor layer and a second initialization gate electrode. One side of the second initialization semiconductor layer may be connected to the initialization voltage line VL through the contact holes CNT4 and CNT5 and the second node connection line 154. The other side of the second initialization semiconductor layer may be connected to the emission control semiconductor layer. The second initialization gate electrode may be provided as a part of the previous scan line SLn-1.

The data line 151, the driving voltage line 152, the first node connection line 153, the second node connection line 154, and the connection electrode 155 may be provided on a same layer and may include a same material. For example, the data line 151, the driving voltage line 152, the first node connection line 153, the second node connection line 154, and the connection electrode 155 may include a material having high conductivity, such as a metal, a conductive oxide, or the like.

Figure 5:
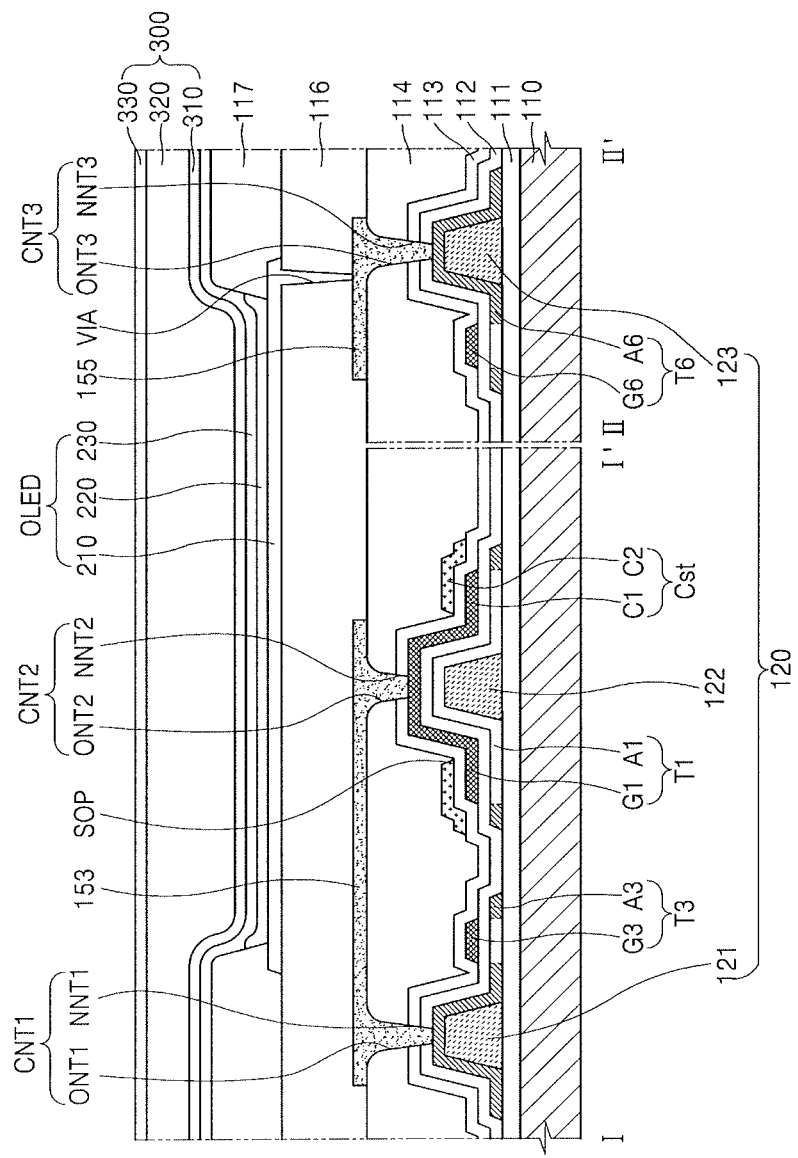
FIG. 5 illustrates a cross-sectional view of a display apparatus according to an embodiment.

The data line 151 may be connected to a switching source region of the switching TFT T2 through the contact hole CNT8 that penetrates through an organic interlayer insulating layer 114 (see FIG. 4), the second gate insulating layer 113 (see FIG. 5), and the first gate insulating layer 112 (see FIG. 5). The data line 151 may connect a plurality of pixels arranged in the second direction.

The driving voltage line 152 may be connected to an operation control source region of the operation control TFT T5 through the contact hole CNT6 penetrating through the organic interlayer insulating layer 114, the second gate insulating layer 113, and the first gate insulating layer 112.

The driving voltage line 152 may be connected to the upper electrode C2 of the storage capacitor Cst through a contact hole CNT7 penetrating through the organic interlayer insulating layer 114. The driving voltage line 152 may connect the plurality of pixels arranged in the second direction.

The first node connection line 153 may connect the driving gate electrode G1 and a compensation drain region of the compensation TFT T3 through contact holes CNT1 and CNT2. The driving gate electrode G1 may be an island type and may be electrically connected to the compensation TFT T3 by the first node connection line 153. The driving gate electrode G1 may operate as the lower electrode C1 of the storage capacitor Cst. Thus, the first node connection line 153 may be considered as being connected to the lower electrode C1.

One end of the first node connection line 153 may be connected to the lower electrode C1 through the contact hole CNT2. The contact hole CNT2 may be provided in the storage opening SOP of the upper electrode C2 to connect the one end of the first node connection line 153 and the lower electrode C1. The size of the storage opening SOP may be larger than the size of the contact hole CNT2 such that the contact hole CNT2 does not contact the upper electrode C2.

The other end of the first node connection line 153 and the compensation TFT T3 may be connected to each other through the contact hole CNT1. The contact hole CNT1 may be formed to penetrate through the organic interlayer insulating layer 114, the second gate insulating layer 113, and the first gate insulating layer 112. Thus, the other end of the first node connection line 153 may be connected to the drain region of the compensation TFT T3.

The second node connection line 154 may transmit an initialization voltage Vint that initializes the driving TFT T1 and the pixel electrode 210. The second node connection line 154 may be connected to the first and second initialization TFTs T4 and T7 through the contact hole CNT5 penetrating through the organic interlayer insulating layer 114 and the first gate insulating layer 112 and may be connected to the initialization voltage line VL through the contact hole CNT4 penetrating through the organic interlayer insulating layer 114.

The connection electrode 155 may be connected to the emission control drain region of the emission control TFT T6 through the contact hole CNT3 penetrating through the organic interlayer insulating layer 114, the second gate insulating layer 113, and the first gate insulating layer 112. The connection electrode 155 may be connected to the pixel electrode 210 to transmit a signal applied through the emission control TFT T6 to the pixel electrode 210.

The display apparatus according to the current embodiment includes a protruding portion 120 provided to correspond each of the contact holes CNT1 to CNT8. The protruding portion 120 may be provided to correspond to at least one of the contact holes CNT1 to CNT8. Accordingly, there may be one or more protruding portions 120.

Herein, the description or recitation that a protruding portion 120 "corresponds" to a respective contact hole CNT1 to CNT8 indicates that the protruding portion 120 and the contact hole are aligned or overlapping in a stacking direction layers of the display apparatus.

The protruding portion 120 may increase an area where a semiconductor layer below and a conductive layer above are connected, or where a conductive layer below and a conductive layer above are connected, through the contact holes CNT1 to CNT8. Also, the depths of the contact holes CNT1 to CNT8 may be decreased by the protruding portion 120. Accordingly, contact resistance may be decreased by the protruding portion 120, and the sizes of the contact holes CNT1 to CNT8 may be reduced.

Hereinafter, a stacked structure of the display apparatus, according to an embodiment will be described with reference to FIG. 4.

A substrate 110 may include a glass material, a ceramic material, a metal material, or a material having a flexible or bendable characteristic. When the substrate 110 is flexible or bendable, the substrate 110 may include polymer resin, such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). The substrate 110 may have a single layer or multilayer structure including the above material. When the substrate 110 has a multilayer structure, the substrate 110 may further include an inorganic layer. According to some embodiments, the substrate 110 may have a structure of organic material/inorganic material/organic material.

At least one protruding portion 120 is provided on the substrate 110 to correspond to the contact holes CNT1 to CNT3. The protruding portion 120 may protrude from a top surface of the substrate 110. The protruding portion 120 may be provided to correspond to only one of the contact holes CNT1 to CNT3, some of the contact holes CNT1 to CNT3, or all of the contact holes CNT1 to CNT3.

The protruding portion 120 may include a suitable material. For example, the protruding portion 120 may include an organic material. For example, the protruding portion 120 may include polyimide-based resin. photoresist, polyacryl-based resin, benzocyclobutene (BCB), and/or hexamethyldisiloxane (HMDSO). The protruding portion 120 may further include a photoinitiator, such as 2,4,6-trimethylbenzoyl-diphenyl-phosphineoxide (TPO), in addition to the organic material. In some implementations, the protruding portion 120, may include, for example, an inorganic insulating material or a metal.

A buffer layer 111 may cover the protruding portion 120. The buffer layer 111 may be formed throughout the top surface of the substrate 110. The buffer layer 111 may increase flatness of a portion of the top surface of the substrate 110 where the protruding portion 120 is not present. The buffer layer 111 may include an inorganic material, such as silicon oxide, silicon nitride, and/or silicon oxynitride.

A barrier layer may be further provided between the substrate 110 and the buffer layer 111. The barrier layer may prevent or reduce impurities from penetrating into semiconductor layers A1, A3, and A6 from the substrate 110. The barrier layer may include an inorganic material, such as oxide or nitride, an organic material, or a compound of organic and inorganic materials. The buffer layer may be in a form of a single layer or may be a multilayer structure of inorganic and organic materials.

The protruding portion 120 may be provided between the substrate 110 and the buffer layer 111, as shown in FIG. 4. In some implementations, the protruding portion 120 may be provided on the buffer layer 111.

The semiconductor layers A1, A3, and A6 may be provided on the buffer layer 111. The semiconductor layers A1, A3, and A6 may include amorphous silicon or polycrystalline silicon. According to an embodiment, the semiconductor layers A1, A3, and A6 may include an oxide of at least one material selected from indium (In), gallium (Ga), tin (Sn), zirconium (Zr), vanadium (V), hafnium (Hf), cadmium (Cd), germanium (Ge), chromium (Cr), titanium (Ti), and zinc (Zn). The semiconductor layers A1, A3, and A6 may each include a channel region and impurity-doped source and drain regions.

Gate electrodes G1, G3, and G6 may be provided on the semiconductor layers A1, A3, and A6 with the first gate insulating layer 112 therebetween. The gate electrodes G1, G3, and G6 may each include molybdenum (Mo), aluminum (Al), copper (Cu), or titanium (Ti), and may be in a form of a single layer or a multilayer structure. For example, the gate electrodes G1, G3, and G6 may be in a form of a single layer of Mo.

The first gate insulating layer 112 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The second gate insulating layer 113 may be provided to cover the gate electrodes G1, G3, and G6. The second gate insulating layer 113 may include $SiO_2$, $SiN_x$, SiON, $Al_2O_3$, $TiO_2$, $Ta_2O_5$, $HfO_2$, or $ZnO_2$.

The upper electrode C2 of the storage capacitor Cst may overlap the lower electrode C1 with the second gate insulating layer 113 therebetween. In this case, the second gate insulating layer 113 may function as a dielectric layer of the storage capacitor Cst. The upper electrode C2 may include a conductive material, such as Mo, Al, Cu, or Ti, and may be in the form of a single layer or a multilayer structure of the conductive material. For example. the upper electrode C2 may be a single layer of Mo or a multilayer of Mo/Al/Mo.

The organic interlayer insulating layer 114 may be formed throughout the top surface of the substrate 110 to cover the upper electrode C2. The organic interlayer insulating layer 114 may include a general-purpose polymer, such as a photoresist that is a photosensitive organic layer, BCB, polyimide, HMDSO, polymethylmethacrylate (PMMA), or PS, a polymer derivative having a phenol-based group, an acryl-based polymer, an imide-made polymer, an arylether-based polymer an amide-based polymer, a fluorine-based polymer, a p-xylene-based polymer, a vinyl alcohol-based polymer, or a blend thereof.

The organic interlayer insulating layer 114 may be used to enable simple processes and to provide flat top surface. The organic interlayer insulating layer 114 may be formed by coating and hardening an organic material in a liquid state. A flat top surface may be provided according to characteristics of such an organic material. A conductive layer, for example, the first node connection line 153, the connection electrode 155, the data line 151 of FIG. 3, the driving voltage line 152 of FIG. 3, etc., provided on the organic interlayer insulating layer 114 may be flat. Accordingly, defects may be decreased when patterning the first node connection line 153, the connection electrode 155, the data line 151, the driving voltage line 152, etc.

If an inorganic interlayer insulating layer were to be used instead of the organic interlayer insulating layer 114 a layer of an inorganic material could be thickly formed, and then a top surface of the inorganic material layer could be flattened via a subsequent process, such as chemical mechanical polishing. However, in this case, it could take a long time to form the thick inorganic material layer due to characteristics of the inorganic material, and it could take considerable time and cost to perform the subsequent process. In the current embodiment, processes are simplified and costs are reduced by introducing the organic interlayer insulating layer 114.

The first node connection line 153, the connection electrode 155, the data line 151, and the driving voltage line 152 may be provided on the organic interlayer insulating layer 114. The first node connection line 153, the connection electrode 155, the data line 151, and the driving voltage line 152 may include a conductive material, such as Mo, Al, Cu, or Ti, and may have a single layer or multilayer structure of the above conductive material. For example, the first node connection line 153, the connection electrode 155, the data line 151, and the driving voltage line 152 may have a multilayer structure of Ti/Al/Ti.

One end of the first node connection line 153 may be connected to the semiconductor layer A3 through the contact hole CNT1 penetrating through the organic interlayer insulating layer 114, the second gate insulating layer 113, and the first gate insulating layer 112. The contact hole CNT1 may include a first organic contact hole ONT1 defined by the organic interlayer insulating layer 114, and a first inorganic contact hole NNT1 penetrating through the second gate insulating layer 113 and the first gate insulating layer 112 to communicate with the first organic contact hole ONT1.

The contact hole CNT1 may expose a part of the semiconductor layer A3. According to the current embodiment, a first protruding portion 121 may be provided between the substrate 110 and the semiconductor layer A3 to correspond to the contact hole CNT1. Accordingly, the semiconductor layer A3 provided above the first protruding portion 121 may protrude while having curvature according to a top shape of the first protruding portion 121, inside the contact hole CNT1. Low contact resistance may be provided due to an increase in a contact area between the semiconductor layer A3 and the first node connection line 153 led into the contact hole CNT1. Also, the first protruding portion 121 may operate as an align mark for forming the contact hole CNT1, thereby reducing a process error.

The other end of the first node connection line 153 may be connected to the lower electrode C1 of the storage capacitor Cst or the driving gate electrode G1 of the driving TFT T1 through the contact hole CNT2 penetrating through the organic interlayer insulating layer 114 and the second gate insulating layer 113. The contact hole CNT2 may include a second organic contact hole ONT2 defined by the organic interlayer insulating layer 114 and a second inorganic contact hole NNT2 penetrating through the second gate insulating layer 113 to communicate with the second organic contact hole ONT2.

The connection electrode 155 may be connected to the semiconductor layer A6 through the contact hole CNT3 penetrating through the organic interlayer insulating layer 114, the second gate insulating layer 113, and the first gate insulating layer 112. The contact hole CNT3 may include a third organic contact hole ONT3 defined by the organic interlayer insulating layer 114 and a third inorganic contact hole NNT3 penetrating through the second gate insulating layer 113 and the first gate insulating layer 112 to communicate with the third organic contact hole ONT3.

A planarization layer 116 may be located on the first node connection line 153 and the connection electrode 155. The planarization layer 116 may include an organic material, such as acryl, BCB, PI, or HMDSO. In some implementations, the planarization layer 116 may include an inorganic material. The planarization layer 116 may function as a protection layer covering the driving and switching TFTs T1 and T2, the compensation TFT T3, the first initialization TFT T4, the operation control TFT T5, the emission control TFT T6, and the second initialization TFT T7. The planarization layer 116 may be in a form of a single layer or a multilayer structure. The planarization layer 116 may provide a flat top surface.

The organic light-emitting diode OLED including the pixel electrode 210, an opposite electrode 230, and an intermediate layer 220 provided therebetween and including an emission layer may be provided on the planarization layer 116.

The pixel electrode 210 is connected to the connection electrode 155 through a via hole VIA defined in the planarization layer 116. The pixel electrode 210 may be connected to the emission control drain region of the emission control TFT T6 by the connection electrode 155.

A pixel-defining layer 117 may be provided on the planarization layer 116. The pixel-defining layer 117 may define a pixel by providing an opening corresponding to each sub-pixel, i.e., an opening exposing at least a center portion of the pixel electrode 210. The pixel-defining layer 117 may increase a distance between an edge of the pixel electrode 210 and the opposite electrode 230 on the pixel electrode 210 so as to help prevent an arc from occurring at the edge of the pixel electrode 210. The pixel-defining layer 117 may be formed of, for example, an organic material such as PI or HMDSO.

The intermediate layer 220 of the organic light-emitting diode OLED may include a low molecular weight material or a high molecular weight material. When the intermediate layer 220 includes a low molecular weight material, the intermediate layer 220 may have a structure in which a hole injection layer (HIL), a hole transport layer (HTL), an emission layer (EML), an electron transport layer (ETL), and an electron injection layer (EIL) are stacked in a single or complex structure. The intermediate layer 220 may include a suitable organic material, such as copper phthalocyanine (CuPc), N,N-di(naphthalene-1-yl)-N,N-diphenyl-benzidine (NPB), or tris-8-hydroxyquinoline aluminum (Alq3). Such layers may be formed via a vacuum deposition method.

When the intermediate layer 220 includes a high molecular weight material, the intermediate layer 220 may have a structure including an HTL, and an EML. As example, the HTL may include PEDOT, and the EML may include a high molecular weight material, such as a poly-phenylenevinylene (PPV)-based or polyfluorene-based material. A structure of the intermediate layer 220 may vary. The intermediate layer 220 may be formed by using a screen printing or inkjet printing method, or a laser induced imaging (LITI) method, as examples.

The intermediate layer 220 may have various structures. The intermediate layer 220 may include a layer integrated throughout the plurality of pixel electrodes 210, or a layer patterned to correspond to each of the plurality of pixel electrodes 210.

The opposite electrode 230 may be provided to cover the display area DA. For example, the opposite electrode 230 may be integrated throughout the plurality of organic light-emitting diodes OLED to correspond to the plurality of pixel electrodes 210.

Such an organic light-emitting diode OLED may be susceptible to damage due to external moisture or oxygen. To prevent or reduce the likelihood of such damage, an encapsulation layer 300 may cover and protect the organic light-emitting diode OLED. The encapsulation layer 300 may cover the display area DA and extend outside the display area DA. The encapsulation layer 300 may include a first inorganic encapsulation layer 310, an organic encapsulation layer 320, and a second inorganic encapsulation layer 330.

The first inorganic encapsulation layer 310 may cover the opposite electrode 230. The first inorganic encapsulation layer may include ceramic, metal oxide, metal nitride, metal carbide, metal oxynitride, indium oxide ($In_2O_3$), tin oxide ($SnO_2$), indium tin oxide (ITO), silicon oxide, silicon nitride, and/or silicon oxynitride. Other layers, such as a capping layer, may be disposed between the first inorganic encapsulation layer 310 and the opposite electrode 230 as desired. When the first inorganic encapsulation layer 310 is formed along a structure therebelow, a top surface of the first inorganic encapsulation layer 310 may not be flat.

The organic encapsulation layer 320 may cover such a first inorganic encapsulation layer 310. Unlike the first inorganic encapsulation layer 310, a top surface of the organic encapsulation layer 320 may be flat. For example, the top surface of the organic encapsulation layer 320 at a region corresponding to the display area DA may be flat. The organic encapsulation layer 320 may include at least one material from acryl, methacrylate, polyester, polyethylene, polypropylene, PET, PEN, PC, PI, PPS, polyoxymethylene, polyarylate, and HMDSO.

The second inorganic encapsulation layer 330 may cover the organic encapsulation layer 320. The second inorganic encapsulation layer 330 may include ceramic, metal oxide, metal nitride, metal carbide, metal oxynitride, $In_2O_3$, $SnO_2$, ITO, silicon oxide, silicon nitride, and/or silicon oxynitride.

As such, the encapsulation layer 300 may include the first inorganic encapsulation layer 310, the organic encapsulation layer 320, and the second inorganic encapsulation layer 330. Thus, even when a crack is generated in the thin encapsulation layer 400, the crack may not spread between the first inorganic encapsulation layer 310 and the organic encapsulation layer 320 or between the organic encapsulation layer 320 and the second inorganic encapsulation layer 330 according to the multilayer structure of the encapsulation layer 300. Accordingly, formation of a path along which external moisture or oxygen penetrates into the display area DA may be prevented or reduced.

A spacer for preventing mask damage may be further provided on the pixel-defining layer 117. Various functional layers, such as a polarization layer for reducing external light reflection, black matrix, a color filter, and/or a touch screen including a touch electrode, may be provided on the encapsulation layer 300.

FIG. 5 illustrates a cross-sectional view of a display apparatus according to another embodiment. While describing FIG. 5, like reference numerals the same as in FIG. 4 denote like elements, and thus redundant descriptions will not be repeated.

Referring to FIG. 5, the display apparatus according to the current embodiment may include the substrate 110, the driving TFT T1, the compensation TFT T3, and the emission control TFT T6 respectively including the semiconductor layers A1, A3, and A6 and the gate electrodes G1, G3, and G6, which are provided on the substrate 110, the organic interlayer insulating layer 114 covering the gate electrodes G1, G3, and G6, and conductive layers 153, 155 provided on the organic interlayer insulating layer 114. The conductive layers 153, 155 may be connected to the driving gate electrode G1 or the semiconductor layer A3 and A6 through the contact holes CNT1, CNT2, and CNT3.

The display apparatus according to the current embodiment includes the protruding portion 120 corresponding to the contact holes CNT1, CNT2, and CNT3. The protruding portion 120 may include protruding portions 121 to 123, which may be provided between the substrate 110 and the semiconductor layers A1, A3, and A6. The protruding portions 121 to 123 protrude from the substrate 110. The depths of the contact holes CNT1 to CNT3 may be shallow, as compared to if the protruding portion 120 were not provided. Accordingly, the protruding portions 121 to 123 may provide process advantages. Also, the protruding portion 120 may function as an alignment mark with respect to a mask for forming the contact holes CNT1 to CNT3.

According to the current embodiment, the protruding portion 120 may be formed of a metal or inorganic insulating material. For example, the protruding portion 120 may be in a form of a single layer or a multilayer structure including Mo and/or Ti. In some implementations, the protruding portion 120 may have a single layer or multilayer structure including SiO, SiN, and/or SiON. Also, the protruding portion 120 may be provided on the buffer layer 111. The semiconductor layers A1, A3, and A6 may be provided directly on the protruding portion 120.

The conductive layer may include the first node connection line 153 and the connection electrode 155. One end of the first node connection line 153 may be connected to the semiconductor layer A3 through the contact hole CNT1. The other end of the first node connection line 153 may be connected to the lower electrode C1 of the storage capacitor Cst or the driving gate electrode G1 through the contact hole CNT2. The connection electrode 155 may be connected to the semiconductor layer A6 through the contact hole CNT3.

The contact hole CNT1 may be formed as the first organic contact hole ONT1 penetrating through the organic interlayer insulating layer 114 and the first inorganic contact hole NNTI penetrating through the first and second gate insulating layers 112 and 113 and communicating with each other. The contact hole CNT1 may expose the top surface of the semiconductor layer A3.

The contact hole CNT2 may be formed as the second organic contact hole ONT2 penetrating through the organic interlayer insulating layer 114 and the second inorganic contact hole NNT2 penetrating through the second gate insulating layer 113 and communicating with each other. The contact hole CNT2 may expose the top surface of the lower electrode C1 or driving gate electrode G1.

The contact hole CNT3 may be formed as the third organic contact hole ONT3 penetrating through the organic interlayer insulating layer 114 and the third inorganic contact hole NNT3 penetrating through the first and second gate insulating layers 112 and 113 and communicating with each other. The contact hole CNT3 may expose the top surface of the semiconductor layer A6.

Figure 6:
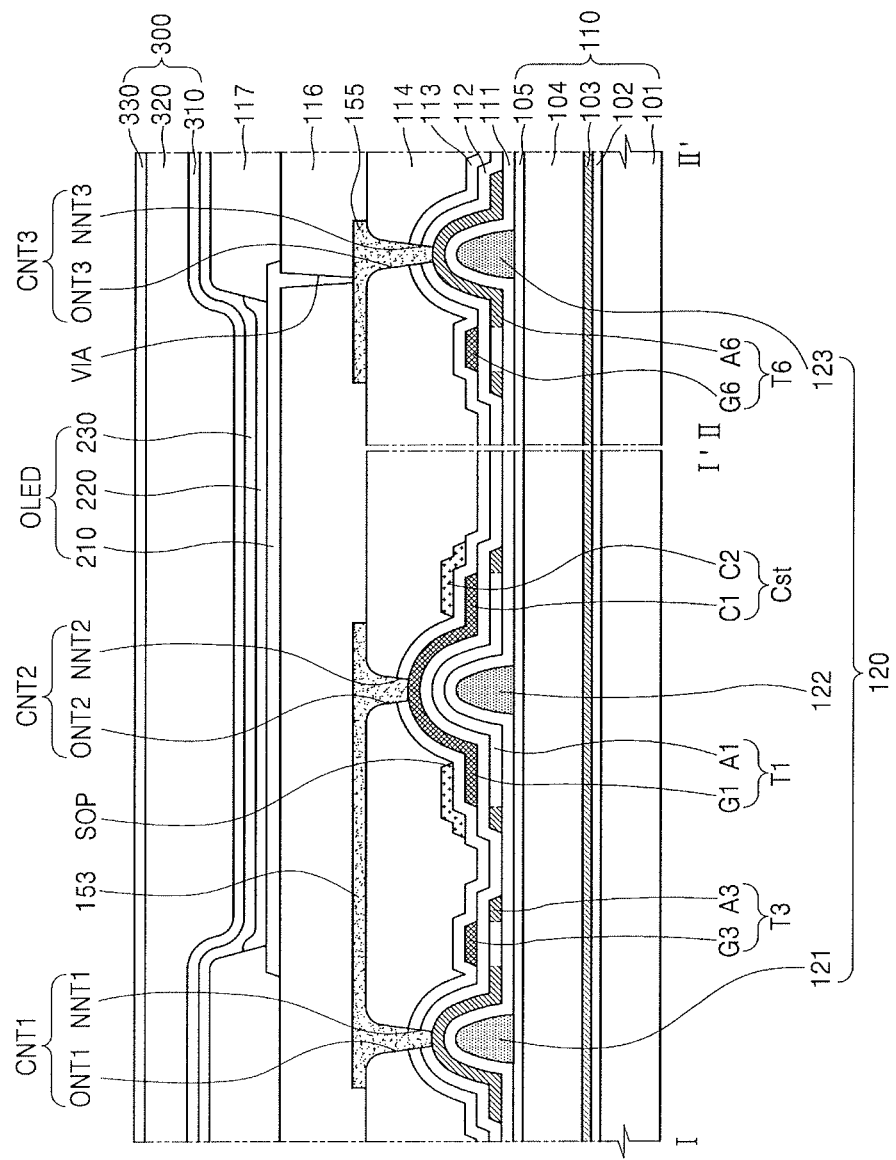
FIG. 6 illustrates a cross-sectional view of a display apparatus according to an embodiment.

FIG. 6 illustrates a cross-sectional view of a display apparatus according to another embodiment. While describing FIG. 6, like reference numerals the same as in FIG. 4 denote like elements, and thus redundant descriptions will not be repeated.

Referring to FIG. 6, the display apparatus according to the current embodiment includes the substrate 110, the driving TFT T1, the compensation TFT T3, and the emission control TFT T6 respectively including the semiconductor layers A1, A3, and A6 and the gate electrodes G1, G3, and G6, which are provided on the substrate 110, the organic interlayer insulating layer 114 covering the gate electrodes G1, G3, and G6, and a conductive layer provided on the organic interlayer insulating layer 114. The conductive layer may be connected to the driving gate electrode G1 or the semiconductor layer A3 and A6 through the contact holes CNT1, CNT2, and CNT3.

The display apparatus according to the current embodiment may include the protruding portion 120 corresponding to the contact holes CNT1, CNT2, and CNT3. The protruding portion 120 may include the protruding portions 121 to 123, which may be provided between the substrate 110 and the semiconductor layers A1, A3, and A6. The protruding portions 121 to 123 may protrude from the substrate 110. The depths of the contact holes CNT1 to CNT3 may be shallow as compared to if the protruding portion 120 were not provided. Accordingly, the protruding portions 121 to 123 may provide process advantages. Also, the protruding portion 120 may function as an alignment mark with respect to a mask for forming the contact holes CNT1 to CNT3.

When a top portion of the protruding portion 120 is curved, the semiconductor layers A1, A3, and A6 or the driving gate electrode G1 provided thereon may also be curved. Thus a contact area of the conductive layer connected to the semiconductor layers A1, A3, and A6 or to the driving gate electrode G1 through the contact holes CNT1, CNT2, and CNT3 may be increased, thereby decreasing contact resistance. Accordingly, the sizes of the contact holes CNT1, CNT2, and CNT3 may be reduced.

According to the current embodiment, the substrate 110 may have a multilayer structure. The substrate 110 may have a structure in which a first resin layer 101, a first barrier layer 102, an intermediate layer 103, a second resin layer 104, and a second barrier layer 105 are stacked on each other.

The first and second resin layers 101 and 104 may be include polymer resin, such as PES, PAR, PEI, PEN, PET, PPS, polyarylate, PI, PC, or CAP.

In order to prevent penetration of moisture or oxygen, the first barrier layer 102 may be provided between the first and second resin layers 101 and 104, and the second barrier layer 105 may be provided on the second resin layer 104. The first and second barrier layers 102 and 105 may be formed of an inorganic material, such as a metal oxide, SiN, SiO, or SiON. The first and second barrier layers 102 and 105 may be in a form of a single layer or a multilayer structure.

The intermediate layer 103 may be provided between the first barrier layer 102 and the second resin layer 104 so as to increase adhesive strength between the first barrier layer 102 and the second resin layer 104. The intermediate layer 103 may include an amorphous material, such as amorphous silicon, ITO, Al, Ti, and/or Mo. In some implementations, the intermediate layer 103 may be formed of a suitable material capable of increasing the adhesive strength between the first barrier layer 102 and the second resin layer 104. The substrate 110 may further include a resin layer, a barrier layer, or an intermediate layer as desired.

As such, when the substrate 110 has a multilayer structure, formation of a path along which external moisture or oxygen penetrates may be prevented or reduced compared to when the substrate 110 has a single layer structure. Thus a defect of the display device may be prevented or reduced.

Also, when the substrate 110 according to the current embodiment includes the intermediate layer 103, detachment between the first barrier layer 102 and the second resin layer 104 may be prevented.

FIGS. 7A through 7G illustrate cross-sectional views of a method of manufacturing a display apparatus, according to an embodiment. In some implementations, operations of FIGS. 7A through 7G may be performed on the substrate 110 provided on a carrier substrate (not shown), and the carrier substrate may be removed after the operation of FIG. 7G.

Figure 7A:
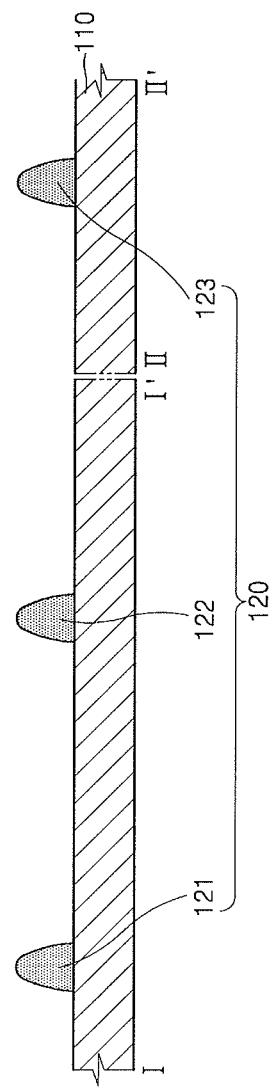
FIGS. 7A through 7G illustrate cross-sectional views of a method of manufacturing a display apparatus, according to an embodiment.

Referring to FIG. 7A, the protruding portion 120 may be formed on the substrate 110. The protruding portion 120 may be formed at a location where a contact hole is to be formed later. The protruding portion 120 may be formed of an organic material, an inorganic insulating material, a metal, or the like. The protruding portion 120 may be formed by coating or depositing a material for forming the protruding portion 120 on an entire surface of the substrate 110, and then performing a mask process. According to an embodiment, the protruding portion 120 may include a photosensitive organic layer. In this case, the protruding portion 120 may be formed via a developing process after an exposure process according to the mask process. In some implementations, when the protruding portion 120 is formed of an organic material, various processes, such as an inkjet printing method, may be used.

When the protruding portion 120 is formed of an inorganic insulating material or a metal, the protruding portion 120 may be formed by depositing the material for forming the protruding portion 120 on the entire surface of the substrate 110, forming a photoresist thereon, and then performing an exposure process and an etching process using a mask.

Figure 7B:
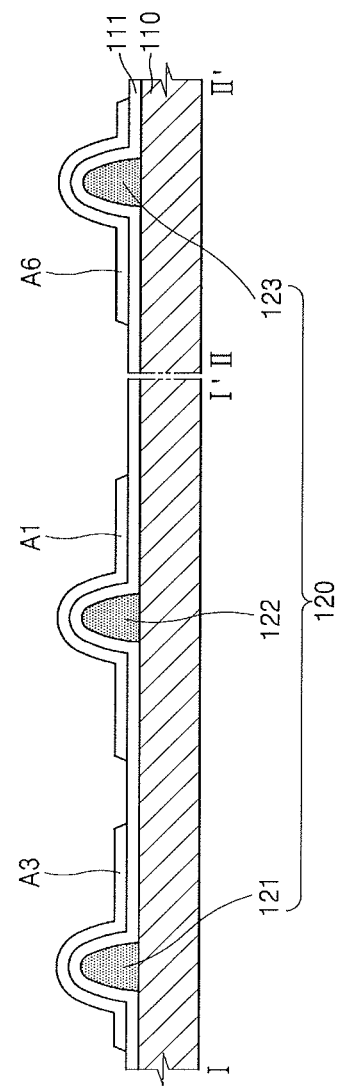

Then, referring to FIG. 7B, the buffer layer 111 and the semiconductor layers A1, A3, and A6 are formed to cover the protruding portion 120 on the entire surface of the substrate 110.

The buffer layer 111 may include an inorganic material, such as SiO, SiN, and/or SiON. The buffer layer 111 may be formed as a single layer or as a multilayer structure. The buffer layer 111 may be formed via any one of various deposition methods, such as a chemical vapor deposition method, a sputtering method, etc.

The semiconductor layers A1, A3, and A6 may be a silicon semiconductor or an oxide semiconductor. According to an embodiment, the semiconductor layers A1, A3, and A6 may include polycrystalline silicon. In this case, amorphous silicon is provided on the entire surface of the substrate 110. Polycrystalline silicon may be provided by annealing the amorphous silicon. The polycrystalline silicon may be patterned via a mask process to form the semiconductor layers A1, A3, and A6.

Figure 7C:
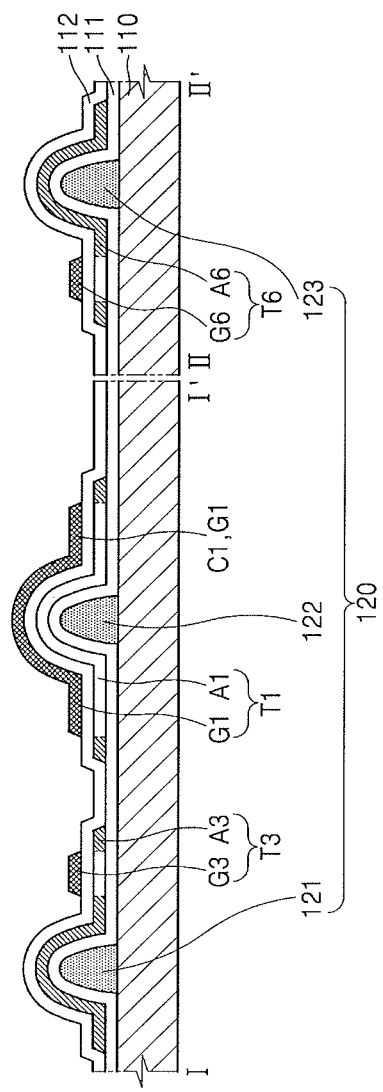

Referring to FIG. 7C, the first gate insulating layer 112 may be formed to cover the semiconductor layers A1, A3, and A6 on the buffer layer 111. The gate electrodes G1, G3, and G6 may be formed on the first gate insulating layer 112.

The first gate insulating layer 112 may include an inorganic material, such as SiO, SiN, and/or SiON. The first gate insulating layer 112 may be formed via a suitable deposition methods, such as, for example, a chemical vapor deposition method.

The gate electrodes G1, G3, and G6 may be formed by coating a conductive material on the first gate insulating layer 112, and then patterning the conductive material by using a mask. The conductive material may include, for example, Mo, Cu, and/or Ti.

After forming the gate electrodes G1, G3, and G6, impurities may be doped on the semiconductor layers A1, A3, and A6 by using the gate electrodes G1, G3, and G6 as a blocking member, thereby forming, on two sides of the semiconductor layers A1, A3, and A6, a source region and a drain region having conductivity as the impurities are doped.

Figure 7D:
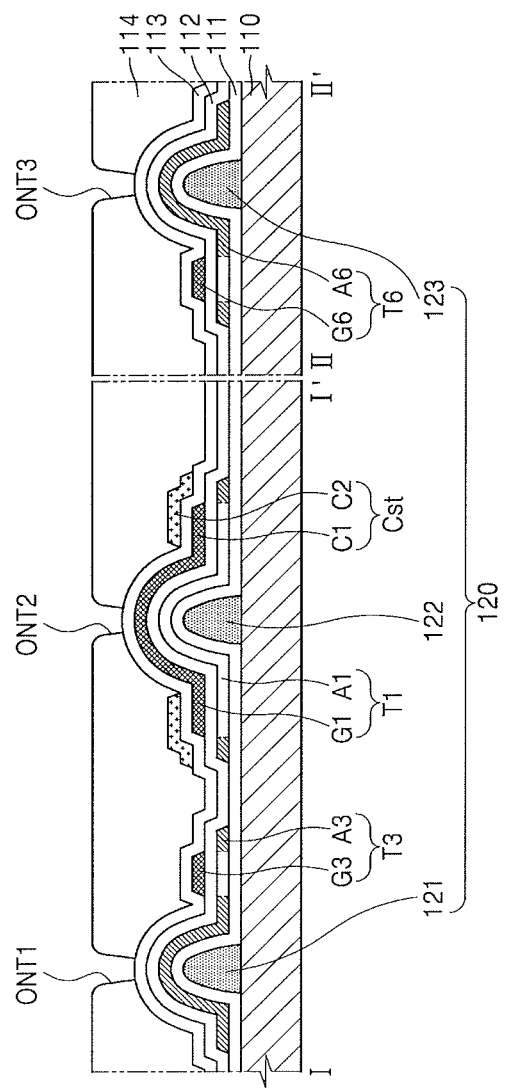

Referring to FIG. 7D, the second gate insulating layer 113 may be formed on the first gate insulating layer 112 to cover the gate electrodes G1, G3, and G6. Then the upper electrode C2 may be formed thereon. The organic interlayer insulating layer 114 may be formed on the second gate insulating layer 113 to cover the upper electrode C2.

The second gate insulating layer 113 may include an inorganic material, such as SiO, SiN, and/or SiON. The second gate insulating layer 113 may be formed by a suitable deposition method, such as, for example, a chemical vapor deposition method.

The upper electrode C2 may be formed by coating a conductive material on the second gate insulating layer 113, and then patterning the conductive material via a mask process (photoresist coating, exposure, and etching processes). The conductive material may include, for example, Mo, Cu, and/or Ti.

The organic interlayer insulating layer 114 may be formed by coating an organic material on the second gate insulating layer 113. When the organic interlayer insulating layer 114 is formed of the organic material, a top surface of the organic interlayer insulating layer 114 may be flat according to characteristics of the organic material.

The first through third organic contact holes ONT1 to ONT3 penetrating through the organic interlayer insulating layer 114 may be formed via a mask process. According to an embodiment. the organic interlayer insulating layer 114 may include a photosensitive organic material. In this case, the organic interlayer insulating layer 114 may be formed via a developing process after an exposure process according to the mask process. In some implementations, the first through third organic contact holes ONT1 to ONT3 may be formed by coating a photoresist on the organic interlayer insulating layer 114, and performing an exposure process, a developing process, and an etching process using a mask.

Figure 7E:
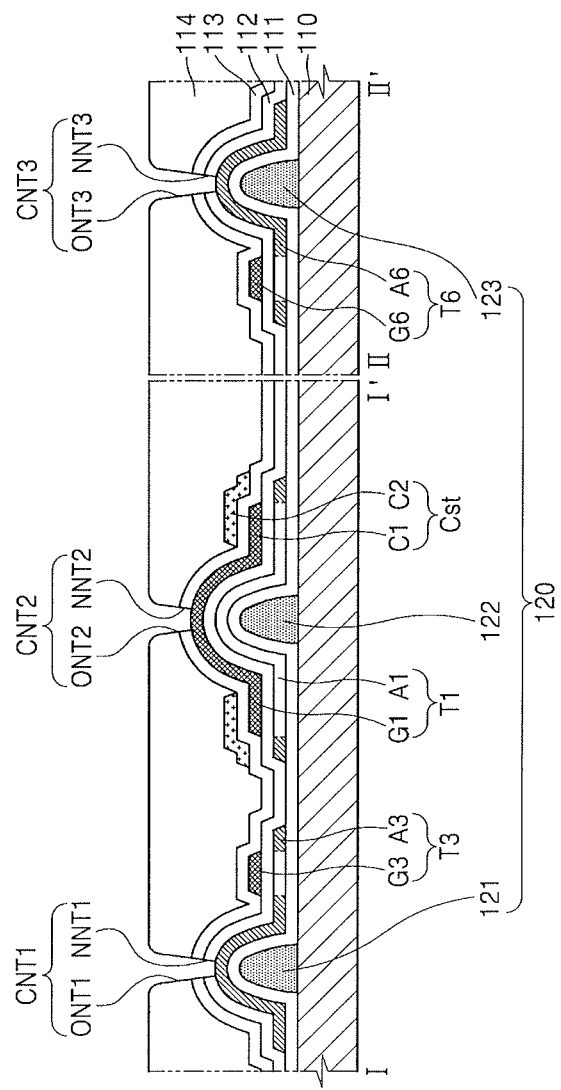

Referring to FIG. 7E, the first through third inorganic contact holes NNT1 to

NNT3 may be formed by using the organic interlayer insulating layer 114 as a blocking member. For example, the first through third inorganic contact holes NNT1 to NNT3 may be formed by etching regions of the organic interlayer insulating layer 114 exposed by the first through third organic contact holes ONT1 to ONT3. The first through third organic contact holes ONT1 to ONT3 may communicate with the first through third inorganic contact holes NNT1 to NNT3 to form the contact holes CNT1 to CNT3.

According to the current embodiment, the organic interlayer insulating layer 114 may function as an existing photoresist forming the contact holes CNT1 to CNT3, and thus processes may be simplified.

Figure 7F:
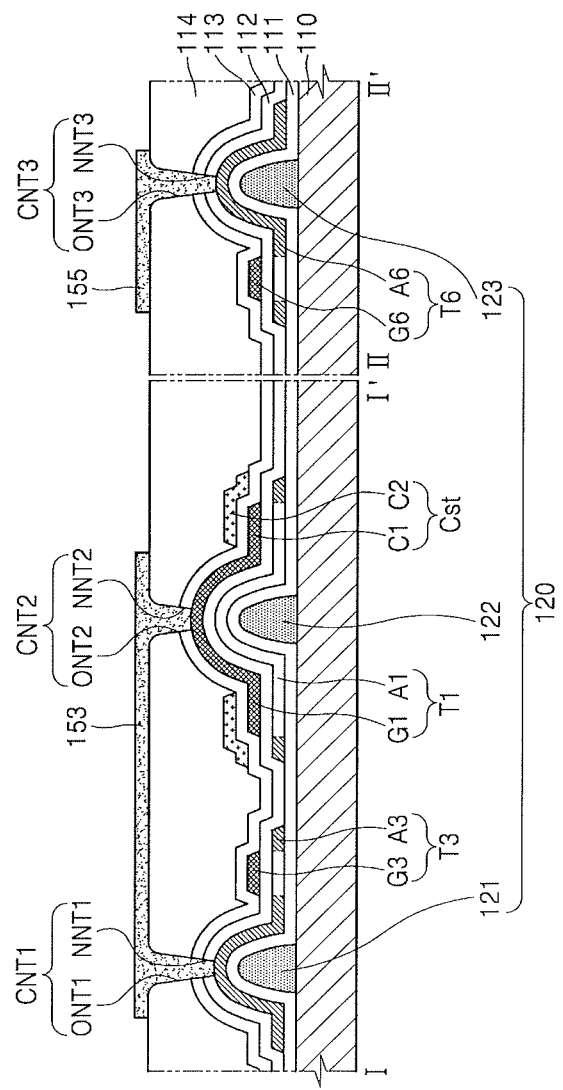

Referring to FIG. 7F, the first node connection line 153 and the connection electrode 155, which are conductive layers, may be formed on the organic interlayer insulating layer 114. The first node connection line 153 and the connection electrode 155 may be simultaneously formed by forming a conductive material on the organic interlayer insulating layer 114, and then patterning the conductive material via a mask process. Portions of the first node connection line 153 and the connection electrode 155 may enter the contact holes CNT1 to CNT3 so as to be connected to the semiconductor layers A1, A3, and A6 or the driving gate electrode G1 exposed by the contact holes CNT1 to CNT3.

Figure 7G:
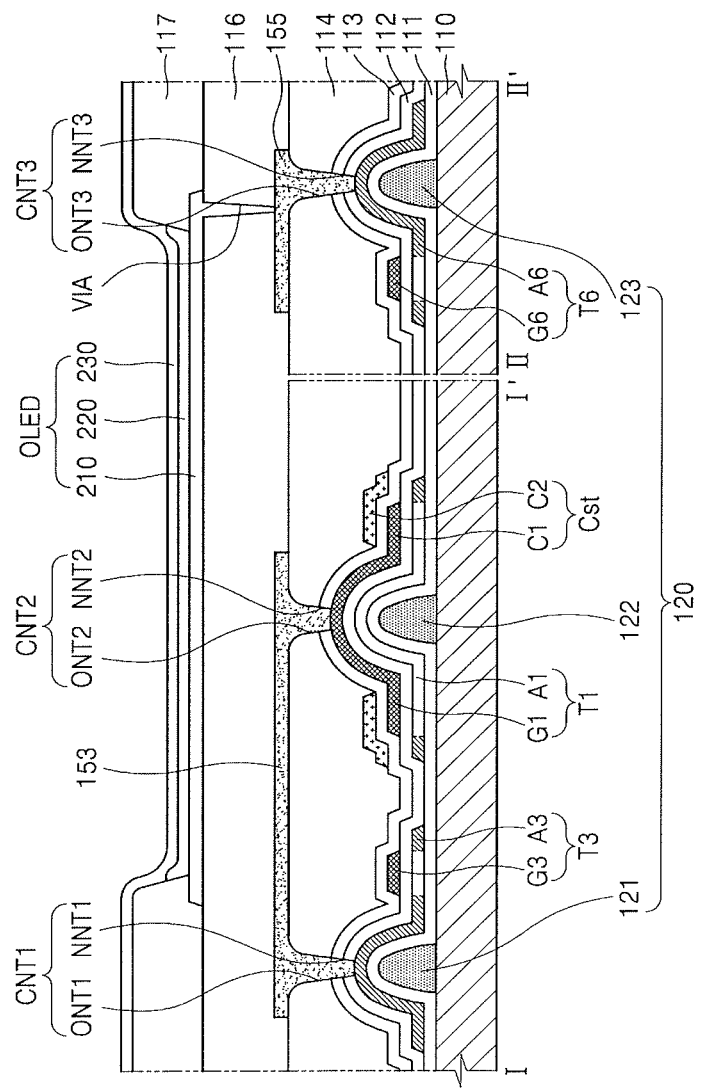

Referring to FIG. 7G, the planarization layer 116 may be formed on the organic interlayer insulating layer 114 to cover the first node connection line 153 and the connection electrode 155. The planarization layer 116 may include a via hole VIA exposing the connection electrode 155. The planarization layer 116 may be formed by forming an organic material to cover all of the first node connection line 153 and the connection electrode 155, and then patterning the via hole VIA via a mask process. The organic material may include, for example, acryl, BCB, PI, or HMDSO.

The pixel electrode 210 may be formed on the planarization layer 116. The pixel-defining layer 117 including an opening exposing a part of the pixel electrode 210 may be formed via a mask process. The pixel electrode 210 may be embedded in the via hole VIA to contact the connection electrode 155. The intermediate layer 220 including an organic emission layer may be formed on the pixel electrode 210. The opposite electrode 230 may be formed on the intermediate layer 220 to form the organic light-emitting diode OLED.

The encapsulation layer 300 (see FIG. 4) and other various functional layers may be further formed on the organic light-emitting diode OLED.

By way of summation and review, a display apparatus according to one or more embodiments includes a protruding portion between a substrate and a semiconductor layer to correspond to a contact hole. The display apparatus includes an organic interlayer insulating layer having a flat top surface. Thus a degree of integration may be high and processes may be efficient.

A display apparatus according to one or more embodiments may include a contact hole having a small size by including a protruding portion below the contact hole. The display apparatus may include a conductive layer having uniform patterning by including an organic interlayer insulating layer having a flat top surface.

One or more embodiments provide a display apparatus having an increased degree of integration and realizing a high-quality image.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A display apparatus, comprising:
    a substrate;
    a first thin-film transistor including a first semiconductor layer on the substrate, and a first gate electrode on the first semiconductor layer, the first gate electrode being insulated from the first semiconductor layer by a first gate insulating layer;
    an organic interlayer insulating layer covering the first gate electrode;
    a first conductive layer on the organic interlayer insulating layer;
    a first contact hole exposing a top portion of the first semiconductor layer by penetrating through the organic interlayer insulating layer and the first gate insulating layer;
    a first protruding portion protruding from a top surface of the substrate between the substrate and the first semiconductor layer, the first protruding portion corresponding to the first contact hole;
    a storage capacitor including a lower electrode spaced apart from the first gate electrode and directly disposed on a same layer as the first gate electrode, and an upper electrode overlapping the lower electrode, the upper electrode being insulated from the lower electrode by a second gate insulating layer; and
    a second protruding portion protruding from the top surface of the substrate between the substrate and the lower electrode of the storage capacitor, the second protruding portion corresponding to the storage capacitor, wherein
    the first conductive layer contacts the first semiconductor layer through the first contact hole,
    a top portion of the organic interlayer insulating layer is flat,
    the first semiconductor layer comprises a first region overlapping with the first protruding portion and a second region non-overlapping with the first protruding portion, and
    a top surface of the first protruding portion is higher than a top surface of the second region of the first semiconductor layer.

2. The display apparatus as claimed in claim 1, further comprising:
    a second contact hole exposing a top portion of the lower electrode by penetrating through the organic interlayer insulating layer and the second gate insulating layer; and
    a second conductive layer on the organic interlayer insulating layer, the second conductive layer contacting the lower electrode through the second contact hole, wherein the second protruding portion corresponds to the second contact hole.

3. The display apparatus as claimed in claim 2, wherein:
    the upper electrode includes a storage opening, and
    the second contact hole is disposed inside the storage opening in plan view.

4. The display apparatus as claimed in claim 2, further comprising a second thin-film transistor overlapping the storage capacitor.

5. The display apparatus as claimed in claim 1, wherein:
    the first protruding portion includes an organic material, and
    a shape of the top surface of the first protruding portion is curved.

6. The display apparatus as claimed in claim 1, wherein the first protruding portion includes at least one of an inorganic insulating material and a metal.

7. The display apparatus as claimed in claim 1, wherein the organic interlayer insulating layer includes a photosensitive organic layer.

8. The display apparatus as claimed in claim 1, further comprising a buffer layer on the substrate, wherein the first protruding portion is between the buffer layer and the first semiconductor layer.

9. The display apparatus as claimed in claim 1, wherein:
the substrate includes a first resin layer, a first barrier layer, a second resin layer, and a second barrier layer, which are stacked sequentially,
the first and second resin layers include an organic material, and
the first and second barrier layers include an inorganic material.

10. The display apparatus as claimed in claim 1, wherein a height of the first protruding portion from the top surface of the substrate is greater than a thickness of the first gate insulating layer.

11. The display apparatus as claimed in claim 1, wherein the first protruding portion provides an increased area of the first semiconductor layer as compared to an equivalent substrate area having no protruding portion.

12. The display apparatus as claimed in claim 11, wherein the second protruding provides an increased area of the lower electrode of the storage capacitor as compared to an equivalent substrate area having no protruding portion.

13. The display apparatus as claimed in claim 1, wherein the second protruding portion does not overlap the upper electrode of the storage capacitor.

14. A display apparatus, comprising:
a substrate;
a thin-film transistor on the substrate, the thin-film transistor including a semiconductor layer and a gate electrode;
a storage capacitor on the substrate;
an organic interlayer insulating layer covering the gate electrode and the storage capacitor;
a conductive layer on the organic interlayer insulating layer;
a contact hole penetrating through the organic interlayer insulating layer and exposing the semiconductor layer or one electrode of the storage capacitor;
a protruding portion between the substrate and the organic interlayer insulating layer, the protruding portion corresponding to the contact hole; and
a buffer layer disposed between the semiconductor layer and the protruding portion, wherein
a thickness of the protruding portion is greater than a thickness of the buffer layer, and wherein a top portion of the organic interlayer insulating layer is flat,
the semiconductor layer comprises a first region overlapping with the protruding portion and a second region non-overlapping with the protruding portion, and
a top surface protruding portion is higher than a top surface of the second region of the semiconductor layer.

15. The display apparatus as claimed in claim 14, wherein the organic interlayer insulating layer includes a photosensitive organic material.

16. The display apparatus as claimed in claim 14, wherein:
the protruding portion includes an organic material, and
a shape of the top surface of the protruding portion is curved.

17. The display apparatus as claimed in claim 14, wherein the protruding portion includes at least one of an inorganic insulating material and a metal.

18. The display apparatus as claimed in claim 14, wherein a height of the protruding portion from a top surface of the substrate is greater than a total thickness of the semiconductor layer and the gate electrode.

19. The display apparatus as claimed in claim 14, wherein the gate electrode is directly electrically connected to the storage capacitor.

* * * * *